(12) United States Patent
Prat et al.

(10) Patent No.: US 7,981,239 B2
(45) Date of Patent: Jul. 19, 2011

(54) PROCESS FOR MANUFACTURING AN ELECTRONIC DISPLAY DEVICE COVERED WITH A PROTECTIVE PLATE

(75) Inventors: Christophe Prat, Coueron (FR); David Vaufrey, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/273,007

(22) Filed: Nov. 18, 2008

(65) Prior Publication Data

US 2009/0133825 A1 May 28, 2009

(30) Foreign Application Priority Data

Nov. 27, 2007 (FR) ...................................... 07 08294

(51) Int. Cl.
*B32B 37/06* (2006.01)

(52) U.S. Cl. ............... 156/275.5; 156/275.3; 156/275.7; 156/272.2

(58) Field of Classification Search ................ 156/275.5
See application file for complete search history.

(56) References Cited

U.S. PATENT DOCUMENTS

| | | | | |
|---|---|---|---|---|
| 5,365,357 A | * | 11/1994 | Ohgawara et al. | 349/111 |
| 5,850,271 A | * | 12/1998 | Kim et al. | 349/111 |
| 2005/0224169 A1 | * | 10/2005 | Flosbach et al. | 156/275.5 |
| 2006/0121363 A1 | * | 6/2006 | Kwon | 430/5 |
| 2006/0220550 A1 | * | 10/2006 | Harada | 313/512 |
| 2009/0004823 A1 | * | 1/2009 | Shimomura et al. | 438/458 |

FOREIGN PATENT DOCUMENTS

| | | |
|---|---|---|
| JP | 2004 247239 | 9/2004 |
| JP | 2007 234332 | 9/2007 |

OTHER PUBLICATIONS

Search Report from corresponding French Patent Application No. 07 08294, filed Nov. 27, 2007.

* cited by examiner

*Primary Examiner* — Philip C Tucker
*Assistant Examiner* — Vicki Wu
(74) *Attorney, Agent, or Firm* — Alston & Bird LLP

(57) ABSTRACT

A process for manufacturing an electronic display device comprising a substrate coated with a display having an active zone and a connection zone, the display being attached by an adhesive crosslinkable by radiation to a protective plate. This process comprises:
a) application of the adhesive to the display and/or this plate;
b) attachment, by bonding, of the plate to the display;
c) radiation through the plate in order to crosslink the adhesive; then
d) removal of one portion of the plate covering the connection zone, with a view to rendering the latter electrically accessible.

Prior to step a) a masking layer that is opaque to the radiation is deposited so that it opposes the crosslinking of the adhesive applied opposite the sole connection zone, and after step d), removed from the connection zone is the uncrosslinked adhesive, which has not been removed with the portion of the protective plate.

17 Claims, 3 Drawing Sheets

PROCESS FOR MANUFACTURING AN ELECTRONIC DISPLAY DEVICE COVERED WITH A PROTECTIVE PLATE

CROSS REFERENCE TO RELATED APPLICATIONS

This application claims priority from French Patent Application No. 07 08294, filed Nov. 27, 2007.

FIELD AND BACKGROUND OF THE INVENTION

The present invention relates to a process for manufacturing an electronic display device, comprising a display covered with a protective plate optionally provided with colored optical filters intended to cooperate with this display. The invention applies, generally, to color or monochrome type displays and, in particular, to compact display devices having a miniature display (i.e. having a "microdisplay").

In a known manner, display devices having a microdisplay such as, for example, those having organic light-emitting diodes (OLEDs), comprise an active zone formed from a pixel matrix and an electrical connection zone which is arranged adjacent to this active zone and which typically comprises an alignment of electrical contacts. These microdisplay devices are manufactured by assembling colored optical filters respectively to color spots of the pixels that form the active part of the microdisplay and that cover a semiconductor substrate typically composed of a silicon wafer. These filters are usually deposited on the inner face of a glass plate that is bonded to the microdisplay, so as to protect it, in the style of an impermeable encapsulation, from the moisture and oxygen of the outside environment.

In general, this assembly is carried out by applying a film of adhesive crosslinkable by ultraviolet radiation over the entire surface of the microdisplay or of the inner face of the protective plate equipped with filters, due to the fact that it is technically difficult to confine this application of adhesive to only the active zone of the microdisplay. The result of this bonding of the protective plate to the microdisplay and of the crosslinking of the adhesive by this radiation through the plate thus assembled is the presence of cured adhesive covering the electrical contacts of the connection zone, which complicates the subsequent operation of "freeing" the contacts via cutting the plate to the right of the separation between the active and connection zones.

To solve this problem of the preservation of the electrical contacts of the microdisplay thus covered by the protective plate, this crosslinkable adhesive has in the past been applied, in particular:

in the form of a bead surrounding the active zone of the microdisplay such as, for example, described in document U.S. Pat. No. 6,825,612 B2, with, as a drawback resulting therefrom, an imperfect protection of the microdisplay by the plate; or selectively over this active zone by display-printing, which has the drawback of requiring a high degree of precision in the application of the spots of adhesive; or else by pre-structuring the assembly face of the protective plate to form therein cavities intended to face the electrical contacts and of much greater depth than the thickness of the film of adhesive applied, so that the adhesive is lodged in these cavities, with, as a drawback, the prior required step of structuring the plate.

SUMMARY OF THE INVENTION

One objective of the present invention is to provide a process for manufacturing an electronic display device that overcomes the aforementioned drawbacks, this device comprising a substrate coated on one at least of its faces with a display, such as a microdisplay, which comprises an active zone formed from a pixel matrix and an electrical connection zone, the display being attached, by means of an adhesive crosslinkable by electromagnetic radiation, to a protective plate that is permeable to this radiation and that has a face for assembly with the display, this process comprising the following steps:

a) application of the adhesive in the uncrosslinked state to the surface of the display and/or of the assembly face of the protective plate;

b) attachment, by bonding, of this assembly face to the display;

c) emission of said radiation through the protective plate in order to crosslink the adhesive; then d) removal of one portion of the protective plate covering said connection zone, with a view to rendering the latter electrically accessible.

For this purpose, the process according to the invention is such that:

prior to step a), a masking layer that is opaque to said radiation is deposited on a predetermined location of the protective plate intended to face said connection zone following step b), so that this layer opposes during step c) the crosslinking of the adhesive applied opposite said connection zone, and so that only the adhesive applied opposite said active zone is crosslinked; and that after step d), removed from said connection zone is the uncrosslinked adhesive covering it, which has not been removed with said portion of the protective plate.

The expression "electronic display device" is understood to mean in a known manner in the present description any display, for example a liquid crystal display (LCD), field-emission display (FED) or electroluminescent display, in a nonlimiting manner. As regards the active zone of the or each display, it may be either of the active or passive matrix type.

Advantageously, the or each display of the device manufactured by the process according to the invention is an electroluminescent microdisplay which may be of organic or inorganic type, i.e. that incorporates an organic (respectively inorganic) film between two lower and upper electrodes that respectively serve as anode and cathode for the device and of which one at least is transparent to the light emitted by this microdisplay.

Even more advantageously, the or each display is a microdisplay of "OLED" type, i.e. having organic light-emitting diodes.

As materials that can be used for producing said substrate and the protective plate, mention may respectively be made of any semiconductor material, preferably silicon or silicon-on-glass, and any material permeable to said radiation and advantageously to the light emitted by the display, such as glass or a plastic.

Regarding the protective plate, it may, in the particular case of a color display, be provided with colored optical filters on its face for assembly with the display, so that these filters are applied in the aforementioned step b) opposite corresponding color points of each of the pixels of the display. It should be noted that the display of the device according to the invention might not require the addition of colored optical filters to this protective plate, which would then make it possible to simply encapsulate the display.

According to another feature of the invention, said connection zone of the or each display may be formed by at least one alignment of connectors located outside of said active zone and, for example, in the vicinity of a peripheral edge of the display.

It should be noted that this process according to the invention allows an easy spreading of the adhesive over the surface of the protective plate or of the display including the coverage of all or part of the connection zone by this adhesive, it being specified that this adhesive is subsequently found in the state crosslinked by this radiation opposite the active zone of the display, therefore adhering satisfactorily to this active zone, whereas it remains, on the contrary, in the uncrosslinked state (i.e. fluid with a reduced viscosity) opposite the connection zone of the display due to the interposition of said masking layer, therefore not adhering to the electrical connectors of this display.

Advantageously, it is thus possible to apply the adhesive in step a) substantially over the entire surface of said connection zone of the display or, preferably, over the entire surface of said predetermined location of the protective plate.

According to another advantageous feature of the invention, it is possible to remove the uncrosslinked adhesive (i.e. of reduced viscosity, since uncured) from said connection zone simply by dissolving, using a solvent suitable for this adhesive.

The adhesive used in this process according to the invention may be any adhesive crosslinkable by electromagnetic radiation of the visible or invisible range, such as, nonlimitingly, ultraviolet radiation. This adhesive crosslinkable by such ultraviolet radiation may be, for example, an adhesive of single-component or two-component acrylate or epoxy type.

As regards said masking layer that is specifically opaque to this ultraviolet radiation, it is advantageously made from a material based on chromium or aluminum.

Equally advantageously in the specific case of a color display for which the protective plate is equipped with said colored optical filters on its face for assembly with this display, it is possible to use the same material (e.g. based on chromium or aluminum) for producing both said colored optical filters and this masking layer.

Even more advantageously, this masking layer that is opaque to the ultraviolet radiation is exclusively constituted of the metal or of the alloy of metals used to form these filters, preferably chromium or aluminum. It should be noted that this use, for the masking layer, of a commonly used material that is chosen to be identical to that of the filters has the advantage of not requiring an additional step of preparing this layer.

Generally, said masking layer is deposited on the protective plate so that the thickness of this layer is preferably between 50 nm and 100 nm.

Advantageously, said predetermined location where this masking layer is deposited is located on said assembly face (i.e. inner face in the assembled state) of the protective plate.

It should be noted that this deposition on the inner face of the protective plate makes it possible to be free from the deflection phenomenon via diffraction of the beam of radiation reaching the edges of the masking layer, if the latter was deposited on the outer face of the plate.

Preferably, said masking layer is completely removed from the protective plate with said portion of the latter removed during step d), so that this finally obtained plate is completely free of material that is opaque to said radiation.

At the same time as step d), one portion of said substrate that extends between a peripheral edge of the latter and a lateral edge of said connection zone is also removed, in a known manner.

BRIEF DESCRIPTION OF THE DRAWINGS

Other advantages, features and details of the invention will emerge from the remainder of the description that follows with reference to the appended drawings, given solely by way of example, in which:

FIG. 2 is a schematic cross-sectional view of a display device assembled by a known process, illustrating the final step of cutting the substrate and the protective plate to free the connection zone of the microdisplay;

MORE DETAILED DESCRIPTION

Figure 1:
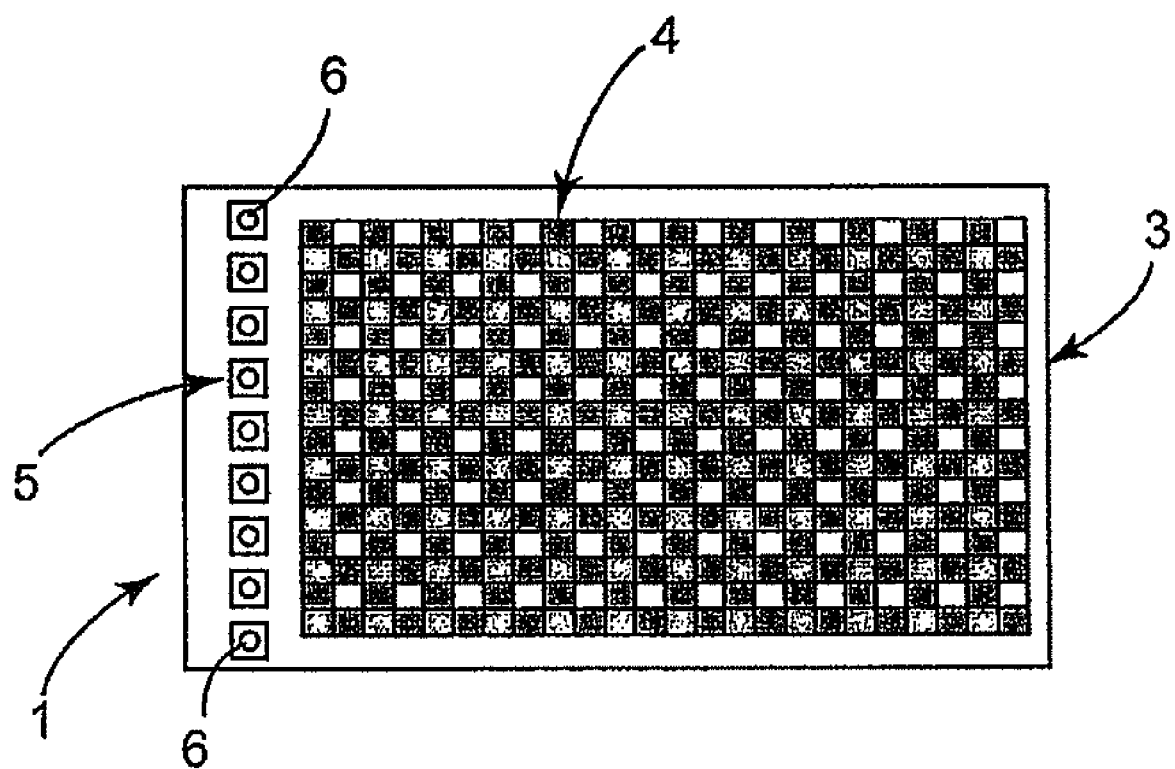
FIG. 1 is a schematic top view of the active and connection zones of a microdisplay of a display device according to the invention, intended to be covered with a protective plate provided with colored filters.

The color electronic display device 1 illustrated in FIG. 1 is in this example of the "OLED" type, comprising, in a known manner, a substrate 2 typically made of silicon or of silicon-on-glass (see FIGS. 2 to 6) coated with a microdisplay 3 which comprises an active zone 4 formed from a pixel matrix and an electrical connection zone 5 outside of the active zone 4. The active zone 4 surmounts an integrated circuit structure represented symbolically in FIGS. 2 to 6 by a source S, a gate G, a drain D, two transistors T1 and T2 and a capacitor "capa". The connection zone 5 is, for example, formed from an alignment of contacts 6 or electrical connectors for establishing a potential difference between the electrodes 7 and 8 integrated into the microdisplay 3.

In this example of an "OLED" light-emitting microdisplay 3 illustrated in FIGS. 2 to 6, an organic film 9 (single-layer or multilayers) is inserted between the two lower 7 and upper 8 electrodes which respectively serve as anode and cathode for the device 1 and of which one at least is transparent to the light emitted by the microdisplay 3 in order to radiate the light emitted toward the outside of the device 1. As regards the organic intercalation film 9, it is designed for transferring the electrons and the holes that come from the electrodes 7 and 8 and that are recombined to generate excitons and therefore the emission of light.

Also in a known manner and as illustrated in FIG. 2, the microdisplay 3 is firstly attached, by means of an adhesive 10 crosslinkable by UV radiation, to a protective plate 11 or encapsulating cover typically made of glass or of plastic that is permeable to this radiation and also advantageously to the light emitted by the microdisplay 3 when the emission takes place through this plate 11, and that may be provided with colored filters 12, 13 and 14 (red, green and blue) on its inner face 11a for assembly with the microdisplay 3, so that the filters 12 to 14 are respectively applied against the color points of each pixel of the active zone 4. Secondly, the cutting, on the one hand, of the substrate 2 to the right of and underneath the outer edge of the connection zone 5 and, on the other hand, of the protective plate 11 at the right of and above the line of separation between the active zone 4 and the connection zone 5, is carried out in order to free the latter zone.

Figure 3:
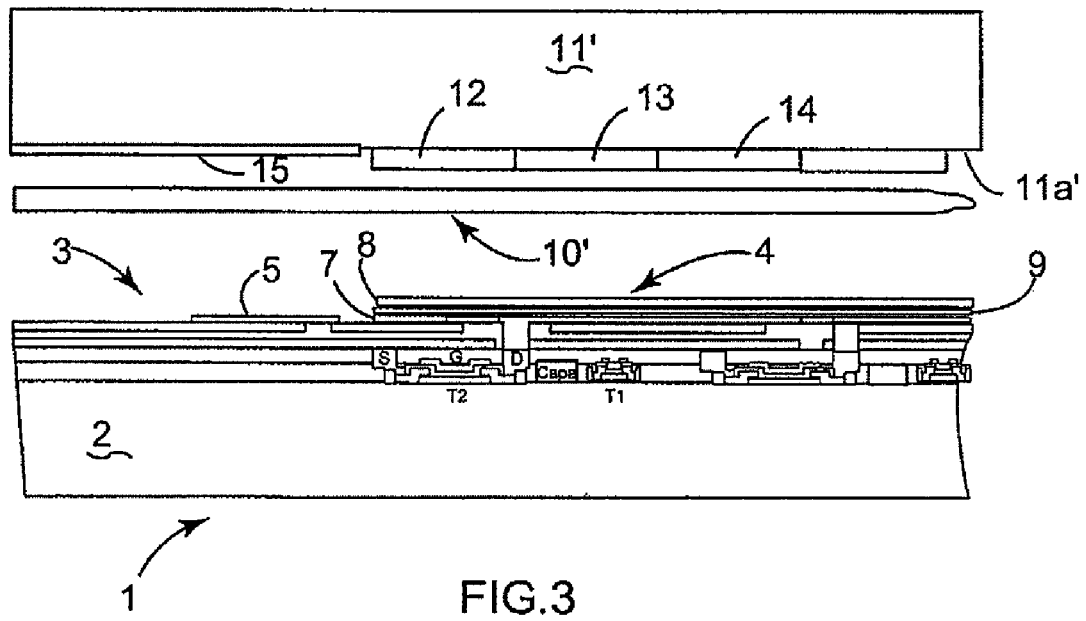
FIG. 3 is an exploded schematic cross-sectional view of a display device for which the protective plate provided with filters has been treated according to the process of the invention before its assembly by bonding to the microdisplay.

FIG. 3 illustrates, in an exploded view, the application of the adhesive 10' in the uncrosslinked state to the entire surface area of the inner face 11a' of the protective plate 11' according to the invention provided, for example, with colored filters 12 to 14, which inner face 11a' has been pretreated by depositing thereon a masking layer 15 that is opaque to UV radiation on a predetermined location of this face 11a' that is intended to face the connection zone 5 during the assembly and that is adjacent to the filters 12 to 14 when the protective plate 11' is equipped therewith.

According to a variant of the invention, the masking layer 15 could be deposited on the outer face of the plate 11' opposite the inner assembly face 11a', on a location of this outer face that is also intended to face the connection zone 5 during the assembly.

As an adhesive 10' crosslinkable by UV radiation that may be used in this process of the invention, mention may be made, for example, of the following adhesives: DELO Katiobond 45952 (single-component epoxy), DELO Photobond 4302 (single-component acrylate), Dymax 425 (single-component acrylate), Dymax X-516-99-E (single-component acrylate), Dymax 628-VLV (single-component acrylate), Polytec PI OG146 (single-component epoxy), Polytec PI OG114-4 (single-component epoxy), Polytec PI 301-2, parts A and B (two-component epoxy), Polytec PI 301-2FL, parts A and B (two-component epoxy), Polytec PI OG142-13 (single-component epoxy) and Epotecni OAD061 (single-component epoxy).

According to one particularly advantageous feature of the invention, the masking layer 15 is composed of a material that constitutes the filters 12 to 14 or that is incorporated in their composition, and this layer 15 that is opaque to UV radiation is preferably constituted of chromium or else aluminum, generally being deposited in a thickness that may vary from 50 nm to 100 nm.

Figure 4:
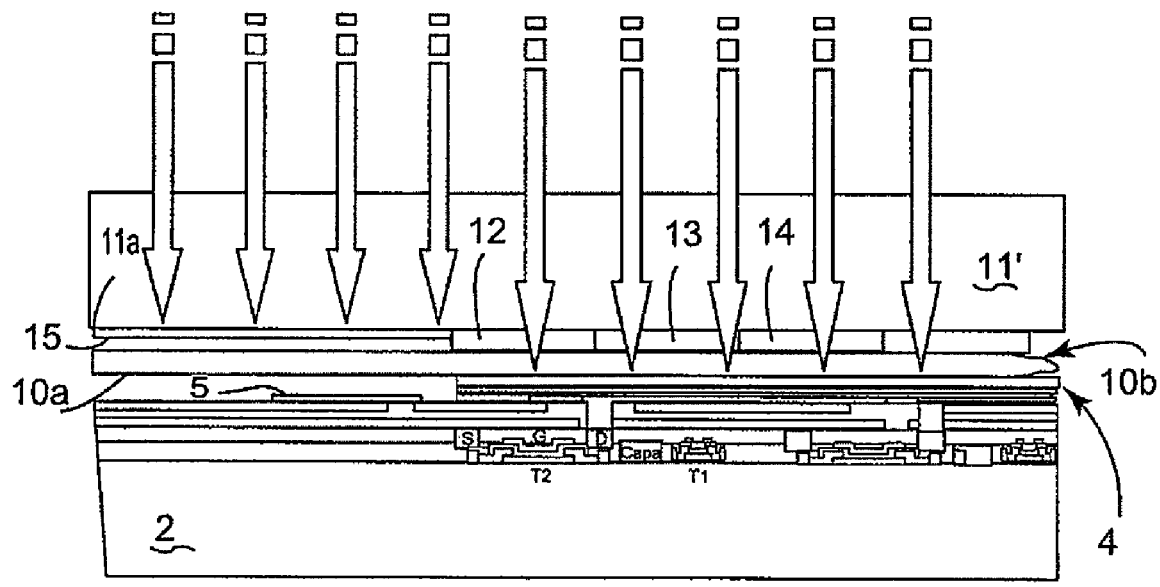
FIG. 4 is a schematic cross-sectional view of the device from FIG. 3 after assembly of the thus treated plate to the microdisplay, illustrating the step of crosslinking one region only of the adhesive applied to the interface by radiation.

As illustrated in FIG. 4, the masking layer 15 opposes the transmission, beneath the plate 11', of the UV radiation (symbolized by the vertical arrows) that has passed through it, this has the effect of not crosslinking the region 10a of the adhesive 10' subjacent to this layer 15 opposite the connection zone 5, whilst this radiation reaches the region 10b of the adhesive 10' subjacent to the filters 12 to 14 opposite the active zone 4 and thus crosslinks this adhesive region 10b.

Figure 5:
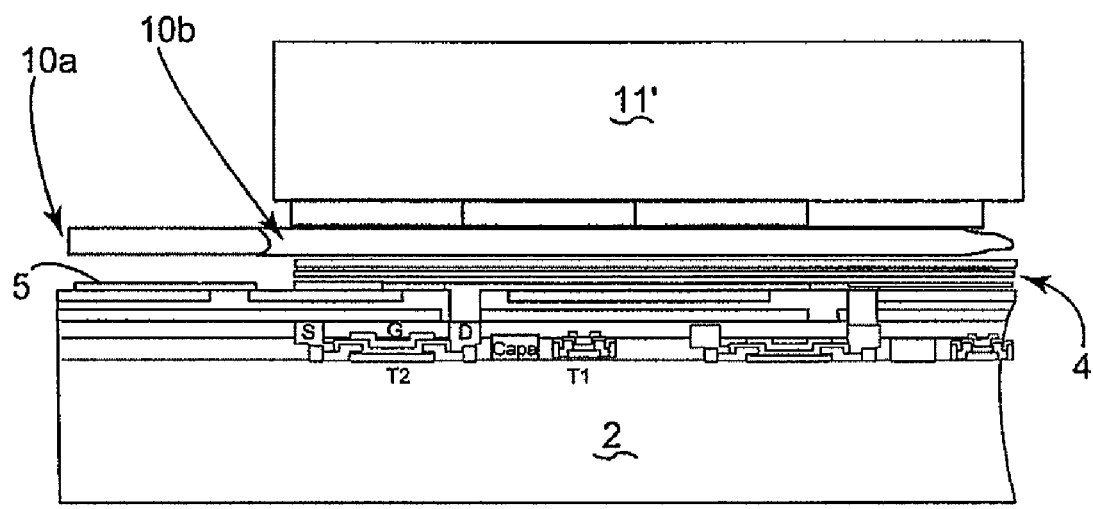
FIG. 5 is a schematic cross-sectional view of the device from FIG. 4 following this crosslinking step, after cutting the substrate and the plate in accordance with FIG. 2.

As seen in FIG. 5, owing to the process according to the invention a film of adhesive 10' is thus obtained, which is divided into two regions 10a and 10b respectively uncrosslinked (i.e. uncured, that is to say in the very fluid state and not adhering to the contacts 6 of the connection zone 5) and crosslinked (i.e. cured, adhering satisfactorily to the active zone 4). Then in a known manner, following the example of FIG. 2, the protective plate 11' is cut to make the connection zone 5 accessible.

Figure 6:
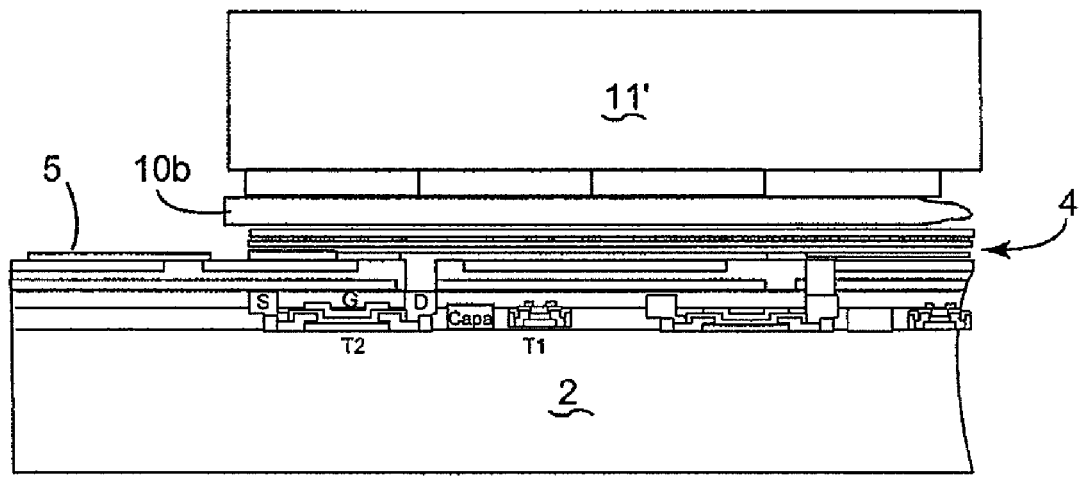
FIG. 6 is a schematic cross-sectional view of the device from FIG. 5, following the step of cleaning the connection zone of the microdisplay covered by the uncrosslinked region of the adhesive.

And as shown in FIG. 6, it is then sufficient to remove from the connection zone 5, by dissolving (using a solvent suitable for the adhesive 10'), this region of uncrosslinked adhesive 10a that covers it and that has not been removed with the cut portion of the protective plate 11'. In this manner, the complete freeing of the electrical contacts 6 of the connection zone 5 is ensured, contrary to the prior art illustrated in FIG. 2 where the adhesive 10 covering these contacts 6 adhered strongly thereto due to its crosslinked state and was therefore capable of hindering the correct operation of the display device.

The invention claimed is:

1. A process for manufacturing an electronic display device comprising a substrate coated on one at least of its faces with a display, which comprises an active zone formed from a pixel matrix and an electrical connection zone, the display being attached, by means of an adhesive crosslinkable by electromagnetic radiation, to a protective plate that is permeable to this radiation and that has a face for assembly with the display, this process comprising the following steps:
   a) applying the adhesive in the uncrosslinked state to the surface of the active zone and of the connection zone of the display and/or of the assembly face of the protective plate configured to face said active and connection zones;
   b) attaching this assembly face to the display by bonding;
   c) emitting said radiation through the protective plate in order to crosslink the adhesive; then
   d) removing one portion of the protective plate covering said connection zone, with a view to rendering the latter electrically accessible,
   wherein
   prior to step a), a masking layer that is opaque to the radiation is deposited on a predetermined location of the protective plate intended to face said connection zone following step b), so that this layer opposes during step c) the crosslinking of the adhesive applied opposite said connection zone, and wherein
   after step d), removed from said connection zone is the uncrosslinked adhesive covering it, which has not been removed with said portion of the protective plate.

2. The process as claimed in claim 1, wherein said predetermined location where said masking layer is deposited is located on said assembly face of the protective plate.

3. The process as claimed in claim 1, wherein the adhesive is applied in step a) substantially over the entire surface of said connection zone of the display or said predetermined location of the protective plate.

4. The process as claimed in claim 1, wherein the uncrosslinked adhesive is removed from said connection zone by dissolving, using a solvent suitable for this adhesive.

5. The process as claimed in claim 1, wherein said connection zone is formed by at least one alignment of connectors located in the vicinity of a peripheral edge of the display.

6. The process as claimed in claim 1, wherein said masking layer is completely removed from the protective plate with said portion of the latter removed during step d), so that this plate is then completely free of material that is opaque to said radiation.

7. The process as claimed claim 1, wherein said adhesive is crosslinkable by ultraviolet radiation, said masking layer being chosen to be opaque to this radiation.

8. The process as claimed in claim 1, wherein said protective plate is provided with colored optical filters on its face for assembly with the display, in such a way that these filters are applied in step b) opposite corresponding color points of each of said pixels.

9. The process as claimed in claim 1, wherein a material based on chromium or aluminum is used for producing said masking layer.

10. The process as claimed in claim 8, wherein a material based on chromium or aluminum is used for producing said masking layer, and wherein this same material based on chromium or aluminum is used for producing said colored optical filters.

11. The process as claimed in claim 1, wherein said masking layer is deposited in a thickness between 50 nm and 100 nm.

12. The process as claimed in claim 1, wherein the or each display is an electroluminescent microdisplay.

13. The process as claimed in claim 12, wherein the or each electroluminescent microdisplay is of organic type, incorporating an organic film between two lower and upper electrodes that respectively serve as anode and cathode for the device and of which one at least is transparent to the light emitted by this microdisplay.

14. The process as claimed in claim 13, wherein the or each microdisplay is an organic light-emitting diode (OLED) display.

15. The process as claimed in claim 1, wherein said substrate is a semiconductor and said protective plate is permeable to the light emitted by the display, this plate being made of glass or plastic.

16. The process as claimed in claim 15, wherein the semiconductor substrate is made of silicon or silicon-on-glass.

17. The process as claimed in claim 7, wherein said adhesive is an acrylate or epoxy type adhesive.

* * * * *